United States Patent
Yu et al.

(10) Patent No.: US 8,033,014 B2
(45) Date of Patent: Oct. 11, 2011

(54) METHOD OF MAKING A MOLDED INTERCONNECT DEVICE

(75) Inventors: Cheng-Hung Yu, Taoyuan County (TW); Chi-En Li, Taipei County (TW)

(73) Assignee: Unimicron Technology Corp., Kwei-San Industrial Zone, Taoyuan (TW)

( * ) Notice: Subject to any disclaimer, the term of this patent is extended or adjusted under 35 U.S.C. 154(b) by 581 days.

(21) Appl. No.: 12/168,164

(22) Filed: Jul. 7, 2008

(65) Prior Publication Data

US 2010/0000086 A1   Jan. 7, 2010

(51) Int. Cl.
*H05K 3/02* (2006.01)
(52) U.S. Cl. ............... 29/846; 29/825; 29/830; 29/831; 29/832
(58) Field of Classification Search .......... 29/846, 29/830, 831, 832, 948; 438/52, 50, 51, 53, 438/597, 672; 156/630, 631, 635, 901; 174/68.5, 174/260, 255, 261
See application file for complete search history.

(56) References Cited

U.S. PATENT DOCUMENTS

| 4,985,601 | A | * | 1/1991 | Hagner ................... 174/261 |
| 4,996,391 | A | * | 2/1991 | Schmidt .................. 174/255 |
| 5,369,881 | A | * | 12/1994 | Inaba et al. ................ 29/846 |
| 6,100,178 | A |   | 8/2000 | Todd et al. |
| 6,967,152 | B1 | * | 11/2005 | Jordan et al. ............ 438/597 |
| 2007/0247822 | A1 |   | 10/2007 | Naundorf |

FOREIGN PATENT DOCUMENTS

| CN | 1314778 | A | 9/2001 |
| EP | 1209959 |   | 3/2004 |
| JP | 06-152098 |   | 5/1994 |
| JP | 07-170077 |   | 7/1995 |

* cited by examiner

*Primary Examiner* — Derris H Banks
*Assistant Examiner* — Tai Nguyen
(74) *Attorney, Agent, or Firm* — Winston Hsu; Scott Margo

(57) ABSTRACT

The present invention provides a method of making a molded interconnect device. The method includes the steps of: injection molding a plastic body having thereon at least one patterned circuit trench structure; and filling a conductive material into the patterned circuit trench structure thereby forming a circuit trace on the plastic body.

12 Claims, 3 Drawing Sheets

METHOD OF MAKING A MOLDED INTERCONNECT DEVICE

BACKGROUND OF THE INVENTION

1. Field of the Invention

The present invention relates generally to a method of fabricating circuit traces on a plastic substrate. More particularly, the present invention relates to a method of making a molded interconnect device.

2. Description of the Prior Art

As known in the art, molded interconnect devices (MIDs) have been used in many applications such as automotive and telecommunication industries. MIDs essentially integrate mechanical and electrical functions into one piece and make an important contribution to design in terms of manufacturability and assembly. Unlike printed circuit boards, which are typically limited to two-dimensional planes, MIDs can implement three-dimensional circuitry. Among other things, a circuit pattern with multiple planes allows better spacing of circuitry, as well as the connected switches and buttons.

Many approaches have been developed for making an MID up to the present. The methods for fabricating an MID and their respective shortcomings can be summarized as follows.

(1) Laser direct structuring (LDS) technique. This method involves the use of a plastic material impregnated with metal catalyst. The plastic material is activated by laser method. After this, the plastic material is metallized using chemical copper process. U.S. publication No. 2007/0247822 discloses such method. The shortcomings of this method include high production cost due to expensive metal catalyst impregnated plastics and laser tools, and environmental pollution issues due to wet chemical process.

(2) Microscopic integrated processing technology (MIPTEC). This prior art method uses chemical vapor deposition (CVD) or sputtering to coat plastic material with conductive material, then uses laser to pattern the conductive material and remove the conductive material from the non-metallized area, followed by chemical copper metallization. The shortcomings of this method include high production cost due to expensive CVD or sputtering tool as well as environmental pollution issues due to wet chemical process.

(3) Hot embossing method. This prior art method is a technique of imprinting microstructures on a substrate (polymer) using a master mold. One of the drawbacks is that the cost of developing molds is high. Besides, there are difficulties of three-dimensional processing.

(4) Two-shot molding method. This method involves two different plastic materials formed by respective injection mold steps. The two different plastic materials include activable and non-activable plastics. The activable plastic is then metallized by wet chemical processes. The drawbacks include bottleneck of mold development, low design flexibility and high cost of development.

In light of the above, there is a need in this industry to provide an improved method of fabricating MIDs, which is cost-effective (no laser tool, CVD tool or sputtering tool is required), flexible and has no environmental pollution issues, thereby overcoming the prior art problems and shortcomings.

SUMMARY OF THE INVENTION

It is one objective of the present invention to provide an improved method of making a molded interconnect device, which is clean and cost-effective, in order to solve the above-mentioned prior art problems.

To achieve the goal, the present invention provides a method of making a molded interconnect device. The method includes the steps of: injection molding a plastic body having thereon at least one patterned circuit trench structure; and filling a conductive material into the patterned circuit trench structure thereby forming a circuit trace on the plastic body.

In one aspect, the present invention discloses a method of making a molded interconnect device including the steps of: providing a body having thereon a first patterned circuit trench structure disposed on a first surface and a second patterned circuit trench structure disposed on a second surface that is not coplanar with the first surface; and filling a conductive material into the first and second patterned circuit trench structures thereby forming a first and second circuit traces on the first and second surfaces of the body.

These and other objectives of the present invention will no doubt become obvious to those of ordinary skill in the art after reading the following detailed description of the preferred embodiment that is illustrated in the various figures and drawings.

DETAILED DESCRIPTION

As previously mentioned, either LDS method or MIPTEC method has a drawback in that the production cost is too high because of the expensive metal impregnated plastic and expensive production tools, and that the employed wet chemical processes have environmental issues. To solve these problems, the present invention discloses a novel and eco-friendly method of making a molded interconnect device, which is cost-effective and is applicable to various injection molded plastic structures to form metallized circuit traces on any surface of the injection molded plastic structure.

Figure 1:
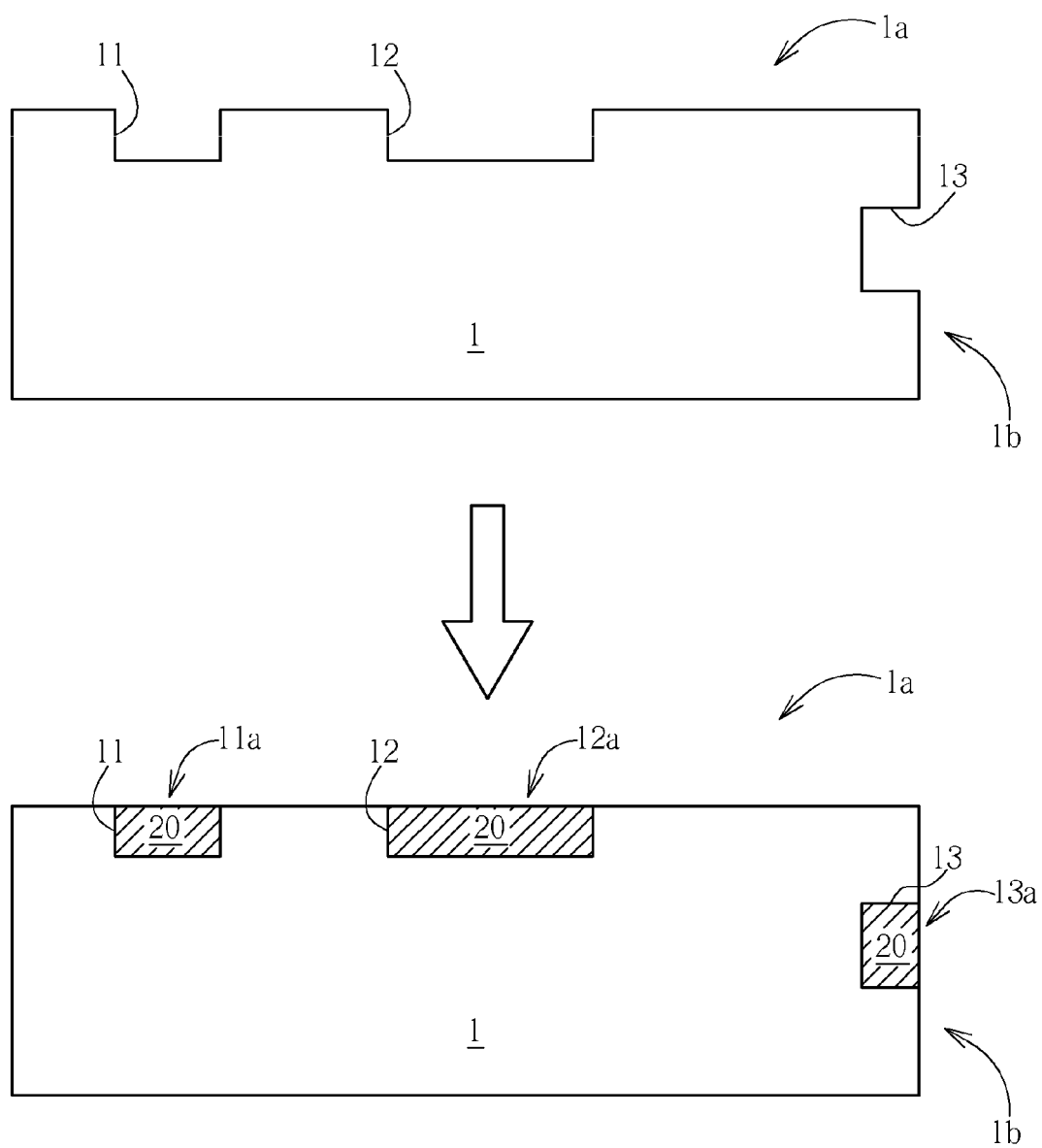
FIG. 1 is a schematic diagram showing the process of making a molded interconnect device in accordance with one preferred embodiment of this invention.

FIG. 1 is a schematic diagram showing the process of making a molded interconnect device in accordance with one preferred embodiment of this invention. As shown in FIG. 1, an injection molded plastic body 1 is provided having thereon a plurality of patterned circuit trenches 11, 12 and 13. The injection molded plastic body 1 may be formed from polycarbonate, acrylonitrile-butadiene-styrene (ABS), polyethylene terephthalate (PET), polybutylene terephthalate (PBT), liquid crystal polymers (LCP), PA 6, Nylon, polyimide, polypropylene, POM, PPS, COC, or any combination thereof. It is understood that the injection molded plastic body 1 may be formed from other plastic materials that have good bonding ability to metals.

According to the preferred embodiment of this invention, the patterned circuit trenches 11 and 12 are situated on the first surface 1a of the injection molded plastic body 1 and the patterned circuit trench 13 is situated on the second surface 1b of the injection molded plastic body 1. The first surface 1a and the second surface 1b are not coplanar and are two different surfaces of the injection molded plastic body 1. Further, the patterned circuit trenches 11, 12 and 13 may have various trench depths depending upon the design requirements.

Thereafter, the patterned circuit trenches 11, 12 and 13 on the injection molded plastic body are filled with conductive material 20 such as copper paste, silver paste, tin paste or any suitable conductive materials, thereby directly forming circuit traces 11a 12a and 13a on the first surface 1a and the second surface 1b respectively.

Figure 2:
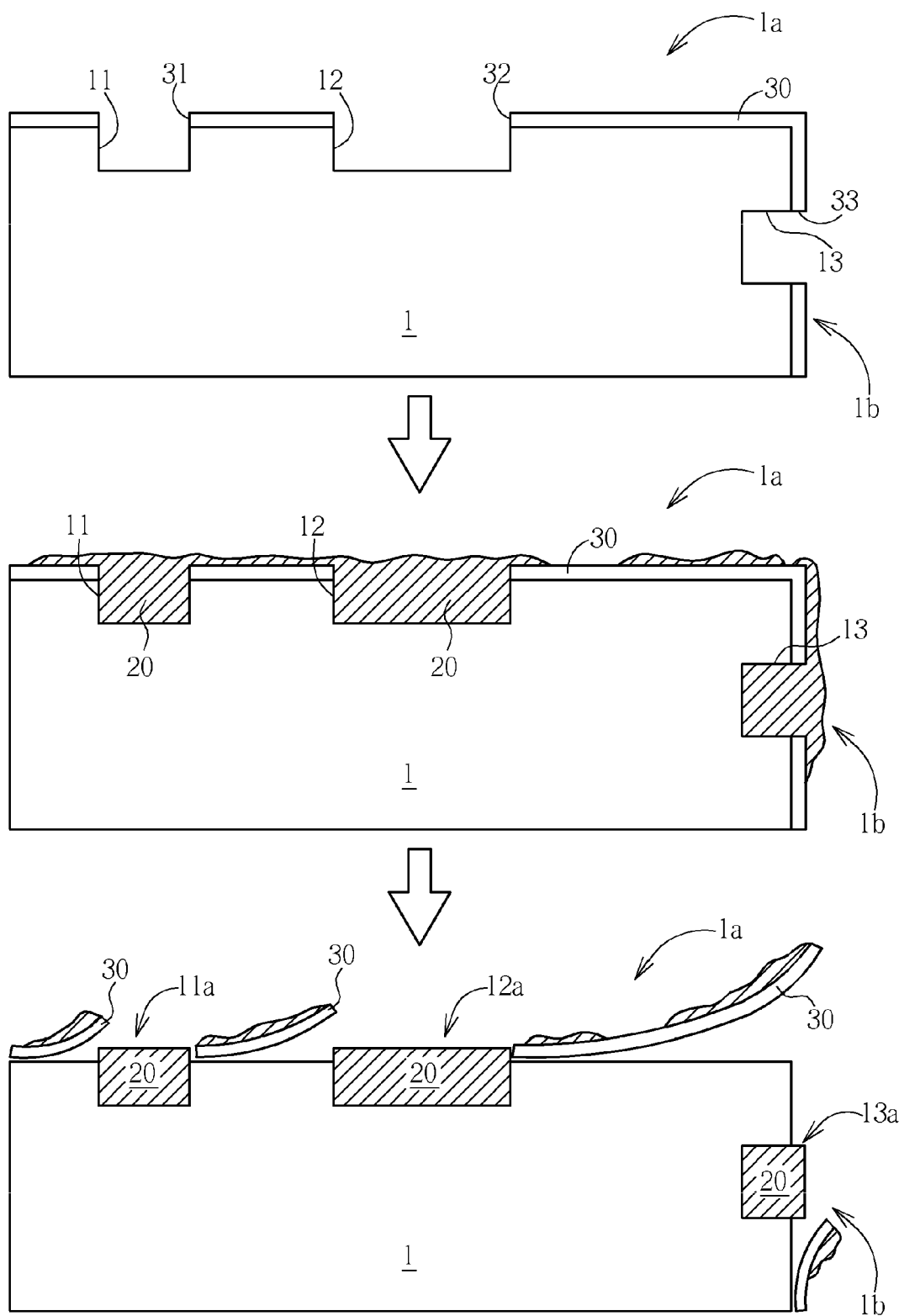
FIG. 2 illustrates a method for selectively filling the patterned circuit trenches of the injection molded plastic body with conductive material according to this invention.

FIG. 2 illustrates a method for selectively filling the patterned circuit trenches of the injection molded plastic body 1 with conductive material according to this invention. First, the surfaces of the injection molded plastic body 1 having thereon the patterned circuit trenches 11, 12 and 13 is covered with a thin film 30. The thin film 30 has openings 31, 32 and 33 corresponding to the patterned circuit trenches 11, 12 and 13. Subsequently, conductive material 20 such as copper paste, silver paste, tin paste or any suitable conductive material is filled into the patterned circuit trenches 11, 12 and 13. Finally, the thin film 30 is stripped off. As shown in FIG. 2, the formed circuit traces 11a, 12a and 13a may slightly protrude from respective surfaces of the injection molded plastic body 1.

Further, depending on the characteristics of the conductive materials employed, a post bake or sintering process may be performed after filling the trenches with the conductive material 20 in order to remove the solvent or dispersing agent inside the conductive material 20 and let metal particles to contact each other. According to the preferred embodiment of this invention, the aforesaid post bake or sintering process is carried out at a temperature preferably under 260° C., but not limited thereto. The practical temperature depends on the curing temperature of paste and melting point or anti-deforming capability of the injection molded plastic body 1. Of course, it is understood that the present invention is not limited to plastic body. Other materials such as ceramic or combination of ceramic and plastic may be used as the body. The ceramic body may be formed by molding methods.

Figure 3:
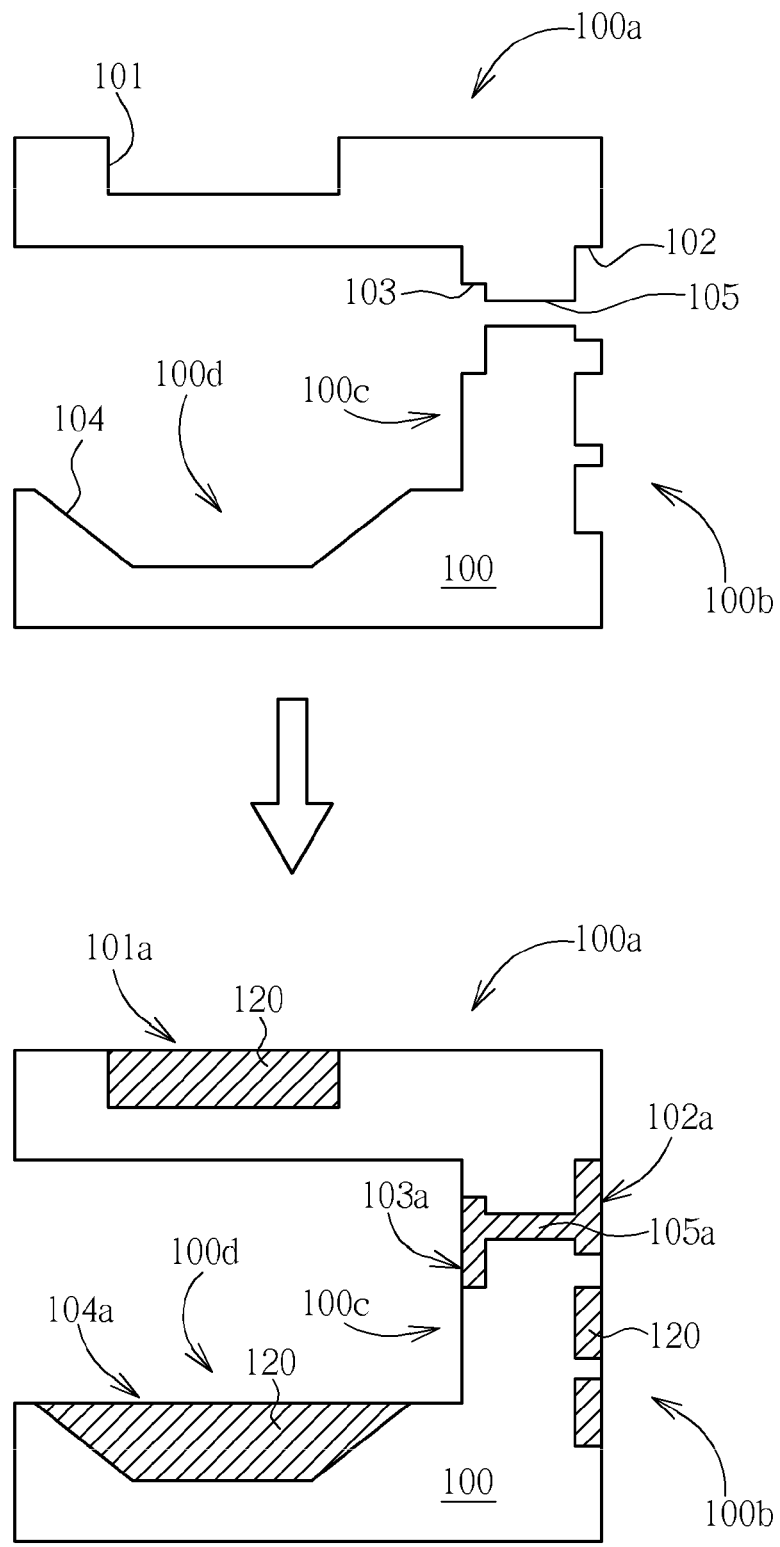
FIG. 3 is a schematic diagram showing the process of making a molded interconnect device in accordance with another preferred embodiment of this invention.

FIG. 3 is a schematic diagram showing the process of making a molded interconnect device in accordance with another preferred embodiment of this invention. As shown in FIG. 3, a body 100 such as injection molded plastic body or ceramic body is provided having thereon a plurality of patterned circuit trenches 101, 102, 103 and 104. The body 100 may be formed from polycarbonate, acrylonitrile-butadiene-styrene (ABS), polyethylene terephthalate (PET), polybutylene terephthalate (PBT), liquid crystal polymers (LCP), PA 6, Nylon, polyimide, polypropylene, POM, PPS, COC, or any combination thereof. The body 100 may be formed from other plastic materials that have good bonding ability to metals. In a case that the body 100 is a ceramic body, the ceramic body may be zirconium oxide, aluminum oxide or chromium carbide doped aluminum oxide alloys.

According to the preferred embodiment of this invention, the patterned circuit trenches 101, 102, 103 and 104 are situated on different surfaces of the body 100, wherein the patterned circuit trench 101 is situated on the first surface 100a, the patterned circuit trench 102 is situated on the second surface 100b, the patterned circuit trench 103 is situated on the third surface 100c, and the patterned circuit trench 104 is situated on the fourth surface 100d. As shown in FIG. 3, the second surface 100b and the third surface 100c are opposite surfaces.

Furthermore, the patterned circuit trenches 101, 102, 103 and 104 may have different trench depths, shapes and sectional profiles depending on the design requirements. Besides, a through hole 105 is provided in the body 100 to communicate the patterned circuit trench 102 with the patterned circuit trench 103.

Thereafter, the patterned circuit trenches 101, 102, 103 and 104 on the body 100 are filled with conductive material 120 such as copper paste, silver paste, tin paste or any suitable conductive materials, thereby directly forming circuit traces 101a 102a, 103a and 104a on the body 100. Depending on the characteristics of the conductive materials employed, a post bake or sintering process may be performed after filling the trenches with the conductive material 120 in order to remove the solvent or dispersing agent inside the conductive material 20 and let metal particles to contact each other. According to the preferred embodiment of this invention, the aforesaid post bake process is carried out at a temperature preferably under 260° C., but not limited thereto. The practical temperature depends on the curing temperature of paste and melting point or anti-deforming capability of the body 100.

Those skilled in the art will readily observe that numerous modifications and alterations of the device and method may be made while retaining the teachings of the invention.

What is claimed is:

1. A method of making a molded interconnect device, comprising:
    providing a body having thereon at least one patterned circuit trench structure;
    covering a thin film on the body but exposing the patterned circuit trench structure;
    filling a conductive material into the patterned circuit trench structure, said conductive material comprises copper paste, silver paste or tin paste; and
    removing the thin film thereby forming a circuit trace on the body, wherein the circuit trace protrudes from respective surfaces of the body.

2. The method according to claim 1 wherein the body is an injection molded plastic body.

3. The method according to claim 1 wherein the body comprises polycarbonate, acrylonitrile-butadiene-styrene (ABS), polyethylene terephthalate (PET), polybutylene terephthalate (PBT), liquid crystal polymers (LCP), PA 6, Nylon, polyimide, polypropylene, POM, PPS, COC, or any combination thereof.

4. The method according to claim 1 wherein the body is a ceramic body formed by molding methods.

5. The method according to claim 1 wherein the body is a combination of ceramic and plastic formed by molding methods.

6. A method of making a molded interconnect device, comprising:
    providing a body having thereon a first patterned circuit trench structure disposed on a first surface and a second patterned circuit trench structure disposed on a second surface that is not parallel to the first surface;
    covering a thin film on the body but exposing the first and second patterned circuit trench structure;
    filling a conductive material into the first and second patterned circuit trench structures, said conductive material comprises copper paste, silver paste or tin paste; and
    removing the thin film thereby forming a first and second circuit traces on the first and second surfaces of the body, wherein the circuit trace protrudes from respective surfaces of the body.

7. The method according to claim 6 wherein a through hole is provide in the body to communicate the first patterned circuit trench structure with the second patterned circuit trench structure.

8. The method according to claim 6 wherein the first patterned circuit trench structure and the second patterned circuit trench structure have different trench depths and shapes.

9. The method according to claim 6 wherein the body is an injection molded plastic body.

10. The method according to claim 9 wherein the body comprises polycarbonate, acrylonitrile-butadiene-styrene (ABS), polyethylene terephthalate (PET), polybutylene terephthalate (PBT), liquid crystal polymers (LCP), PA 6, Nylon, polyimide, polypropylene, POM, PPS, COC, or any combination thereof.

11. The method according to claim 6 wherein the body is a ceramic body formed by molding methods.

12. The method according to claim 6 wherein the body is a combination of ceramic and plastic formed by molding methods.

* * * * *